United States Patent [19]
Woodruff et al.

[11] Patent Number: 5,138,216
[45] Date of Patent: Aug. 11, 1992

[54] MICRO-BEAM TACTILE SENSOR FOR THE MEASUREMENT OF VERTICAL POSITION DISPLACEMENT

[75] Inventors: Garry W. Woodruff, Derry, N.H.; Johannes G. Smits, Quincy, Mass.

[73] Assignees: Digital Equipment Corporation, Maynard; Boston University, Boston, both of Mass.

[21] Appl. No.: 713,280

[22] Filed: Jun. 11, 1991

Related U.S. Application Data

[63] Continuation of Ser. No. 297,437, Jan. 13, 1989, Pat. No. 5,034,645.

[51] Int. Cl.⁵ ............................................. H01L 41/08
[52] U.S. Cl. .................................... 310/316; 310/317; 310/330; 310/332
[58] Field of Search ............... 310/316, 317, 319, 324, 310/328, 330–332, 338, 366, 800

[56] References Cited

U.S. PATENT DOCUMENTS

| | | | |
|---|---|---|---|
| 3,304,773 | 2/1967 | Rogallo | 310/331 X |
| 4,099,211 | 7/1978 | Hathaway | 310/332 X |
| 4,186,324 | 1/1980 | Hartzell, Jr. | 310/330 X |
| 4,310,913 | 1/1982 | Miller | 310/331 X |
| 4,359,892 | 11/1982 | Schnell et al. | 310/332 X |
| 4,456,850 | 6/1984 | Inove et al. | 310/331 X |
| 4,506,437 | 3/1985 | Godejahn, Jr. | 29/577 |
| 4,539,554 | 9/1985 | Jarvis et al. | 310/338 X |
| 4,555,953 | 12/1985 | Dario et al. | 310/338 X |
| 4,565,940 | 1/1986 | Hubbard, Jr. | 310/326 |
| 4,594,526 | 6/1986 | Araki et al. | 310/332 X |
| 4,596,153 | 6/1986 | MacDonald et al. | 73/861.18 |
| 4,634,917 | 1/1987 | Dvorsky et al. | 310/328 |
| 4,663,555 | 5/1987 | Yoshihiro | 310/332 X |
| 4,667,997 | 5/1987 | Udagawa et al. | 310/800 X |
| 4,721,938 | 1/1988 | Stevenson | 338/4 |
| 4,776,924 | 10/1988 | Delapierre | 310/330 UX |
| 4,792,715 | 12/1988 | Barsky et al. | 310/800 X |
| 4,849,668 | 7/1989 | Crawley et al. | 310/330 X |
| 4,868,447 | 9/1989 | Lee et al. | 310/338 X |

Primary Examiner—Mark O. Budd
Attorney, Agent, or Firm—Jones, Tullar & Cooper

[57] ABSTRACT

A piezoelectric tactile sensor is disposed on the end of a flexible silicon beam to sense contact of the beam by an object, such as a circuit chiplead, whose position is to be measured. A piezoelectric actuator is disposed on top of the beam, and a variable DC voltage is supplied to the actuator to cause the beam to deflect into an object whose position is to be measured. Processing circuitry senses the signal generated by the sensor in response to contact with the object, and determines the position of the object from the magnitude of the actuator voltage at that point. To increase the magnitude of the signal generated by the sensor, an AC voltage is also supplied to the actuator to cause the beam to vibrate at a harmonic frequency. A plurality of the beams can be etched from a single wafer of silicon and utilized to simultaneously measure the positions of a plurality of circuit chipleads. The fabrication technique used for forming the beams utilizes a plurality of photolithographic steps to form the beam from a silicon wafer. Due to the fragile nature of the beams once they have been etched, bonding pad areas for the sensor electrodes are formed on the wafer prior to the actual etching of the beams from the wafer. The images of the bonding pad areas are stored on the wafer by covering them with a plurality of protective layers. Once the beams have been etched, the bonding pad areas can be reexposed by simply removing the protective layers without any further photolithographic steps that might damage the beams.

15 Claims, 12 Drawing Sheets

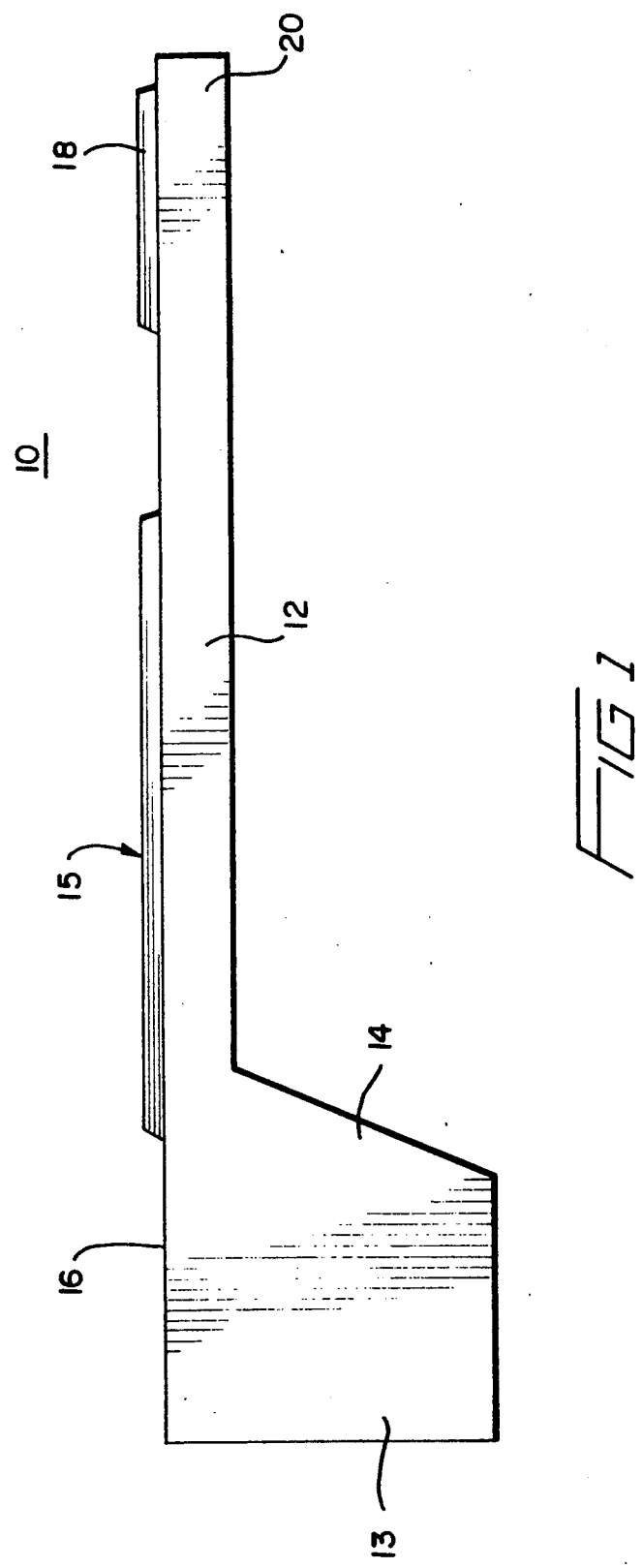

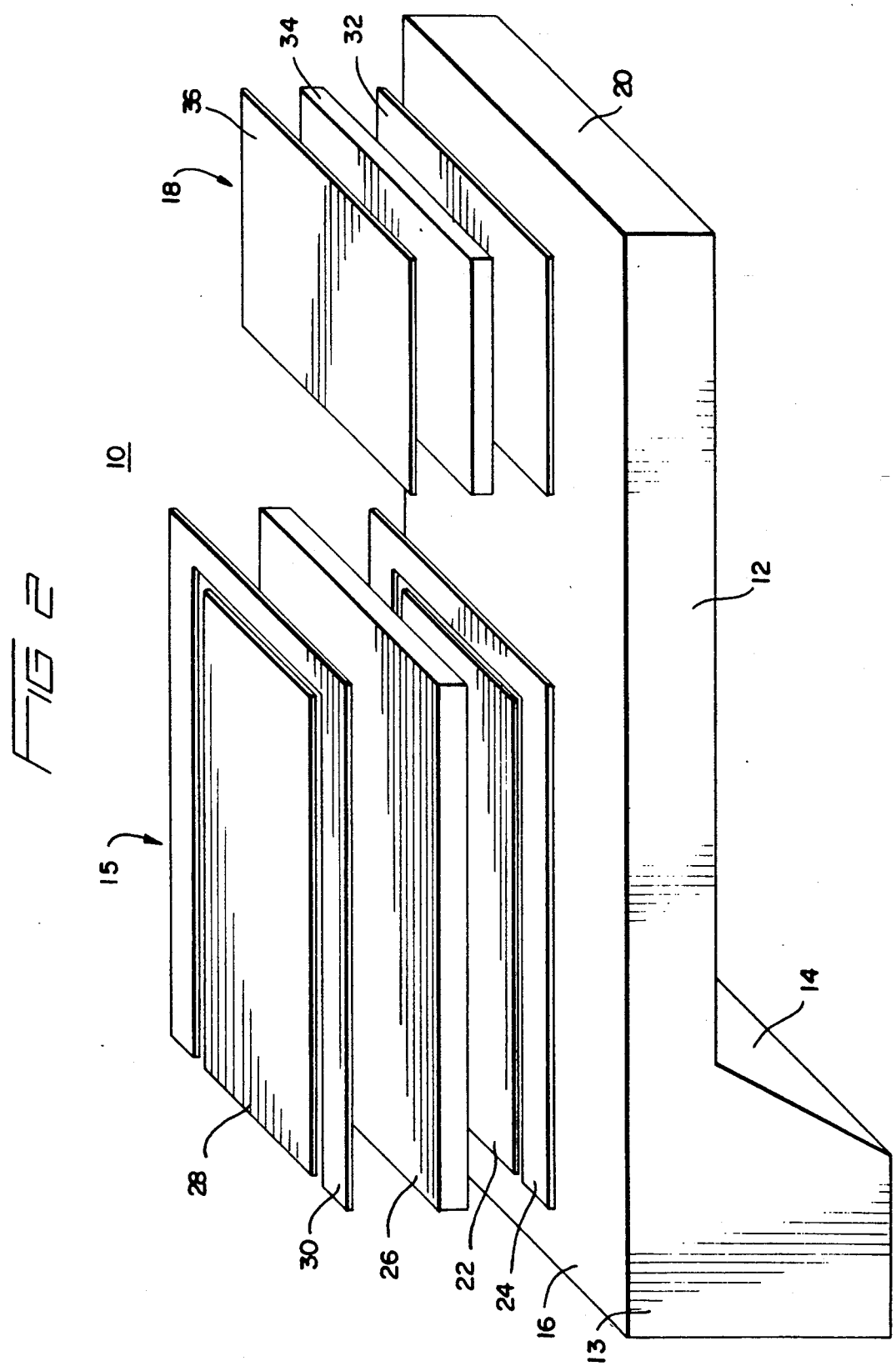

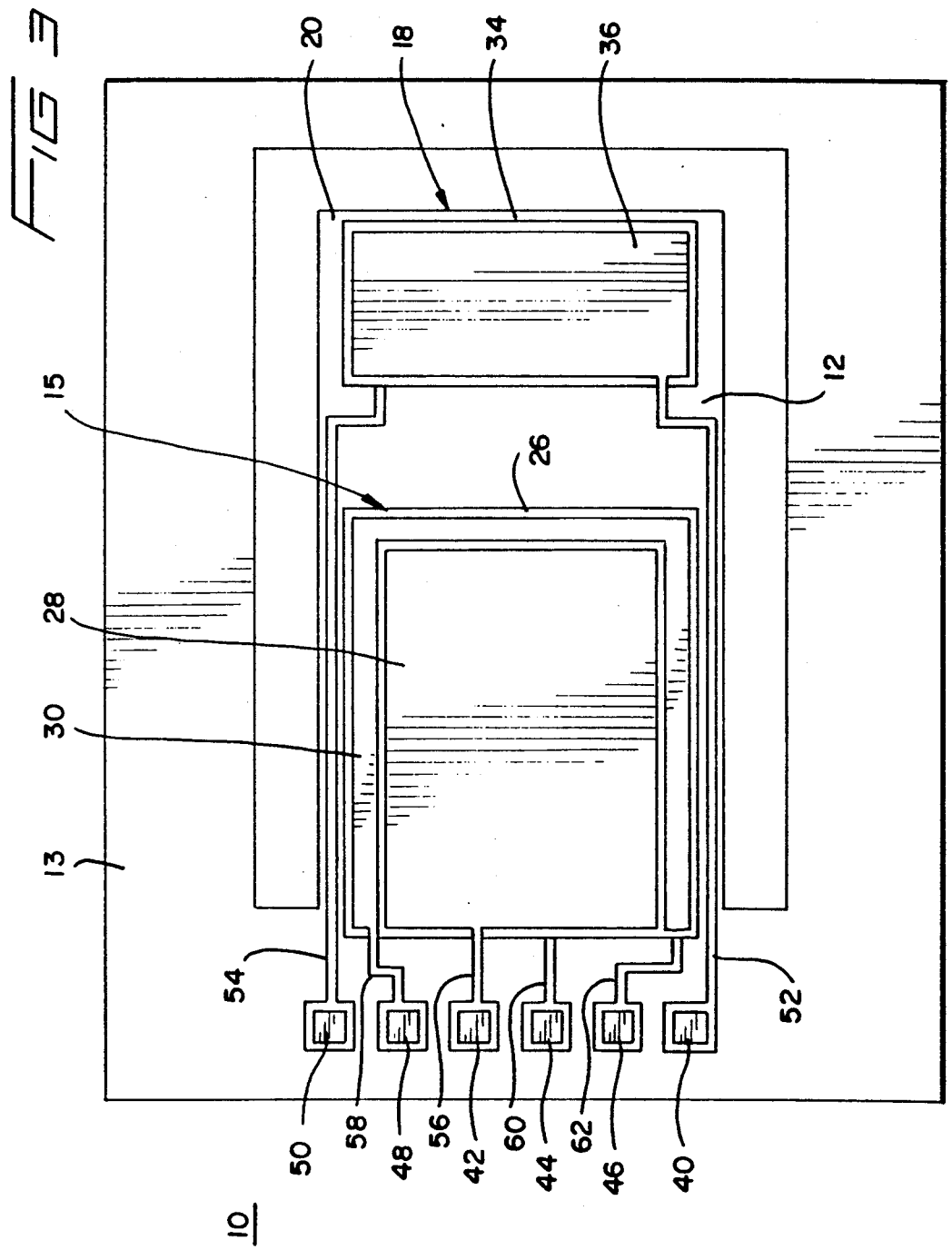

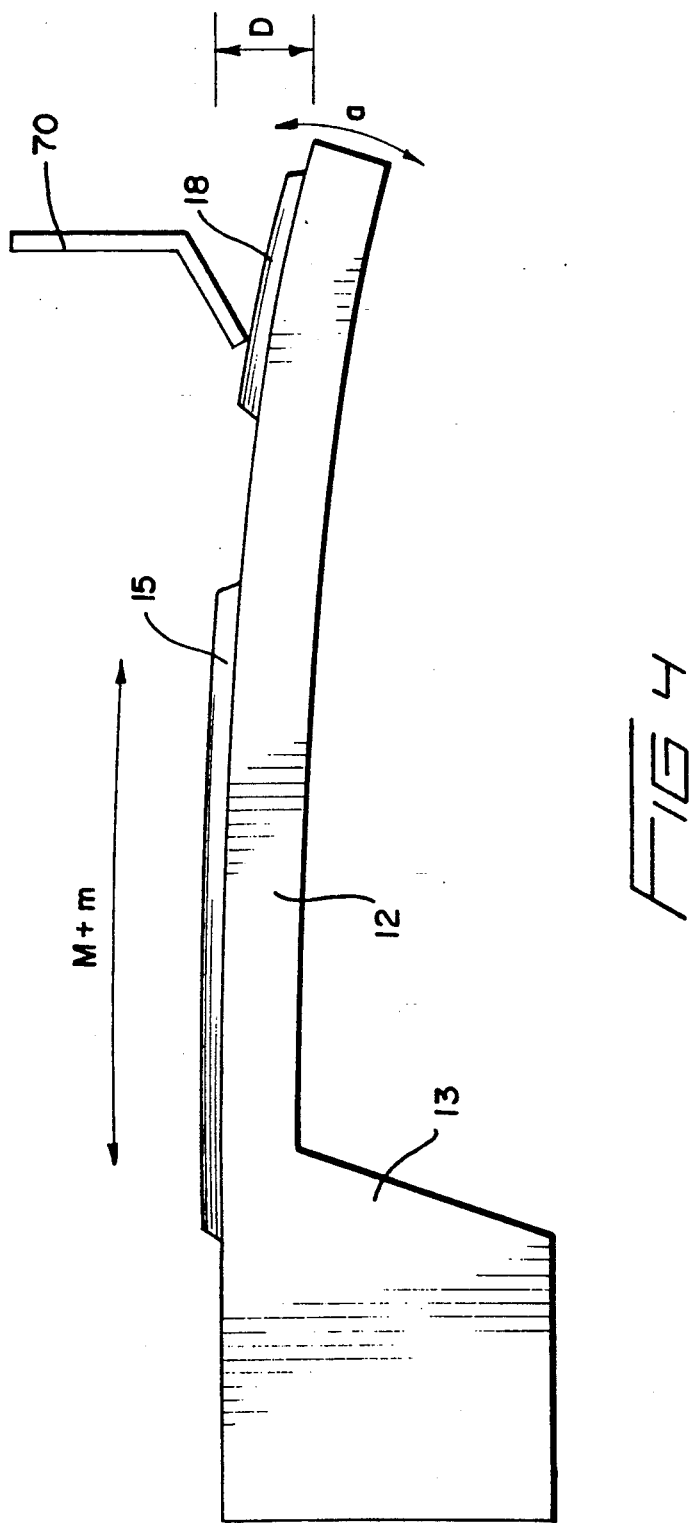

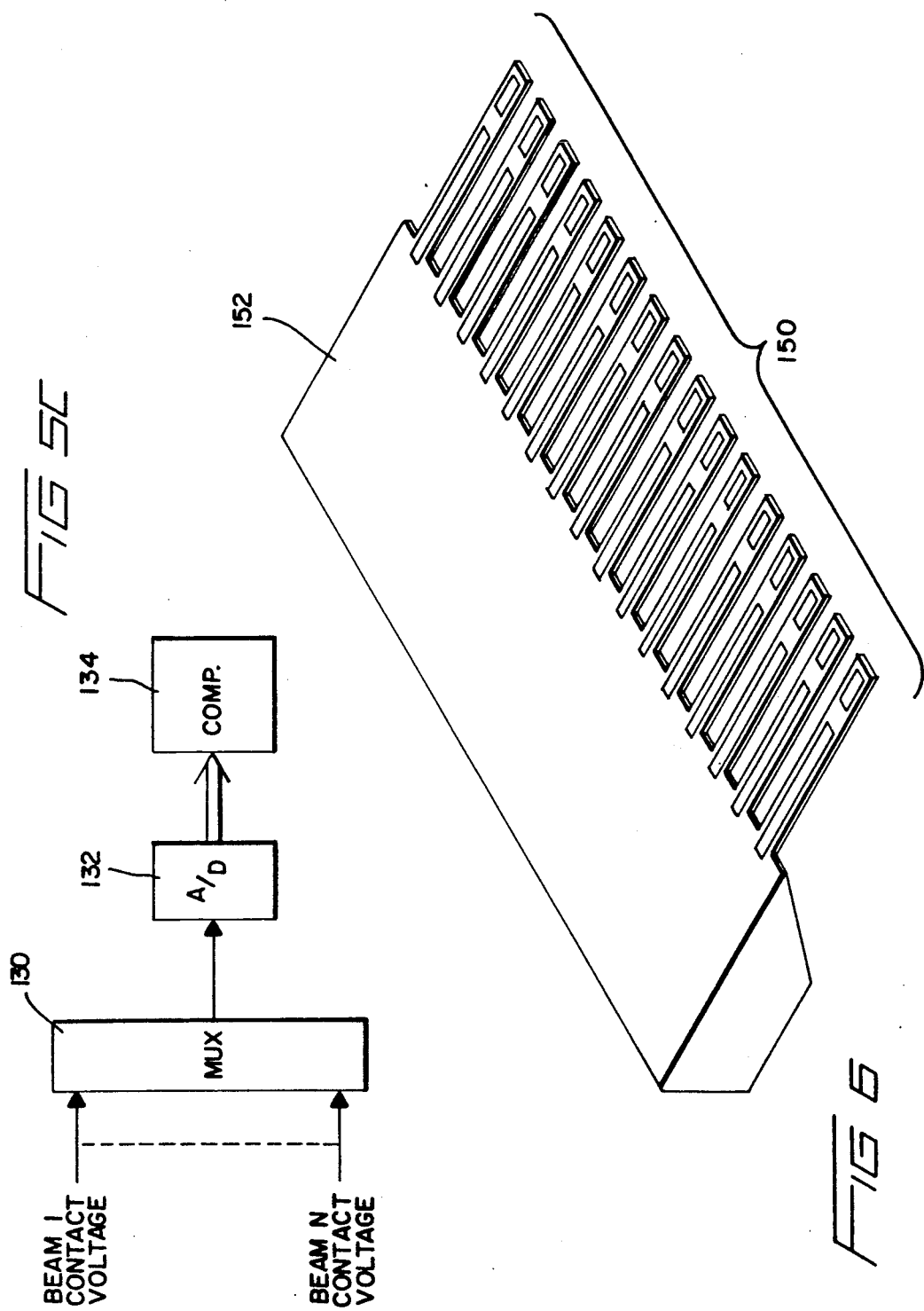

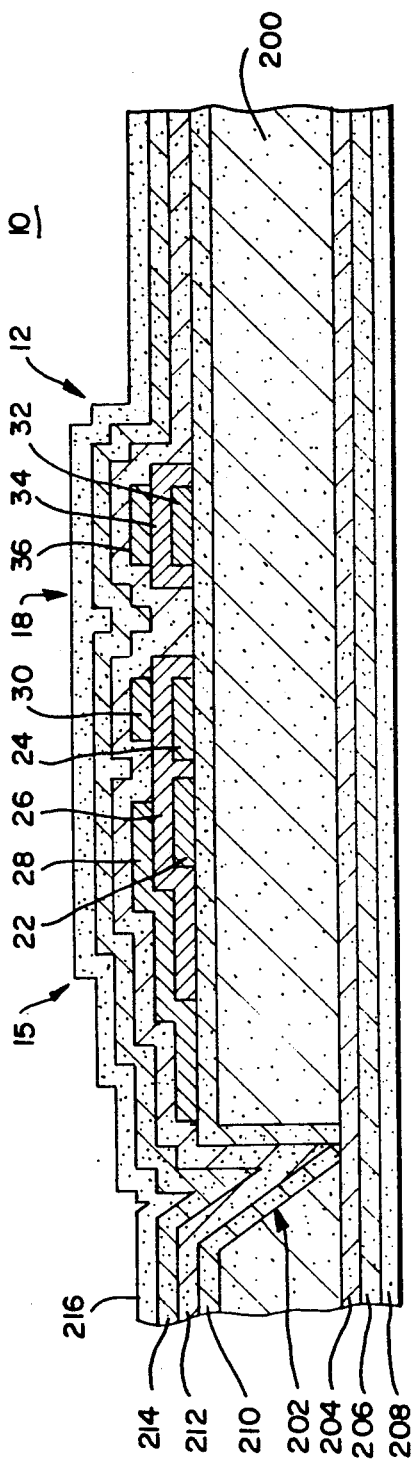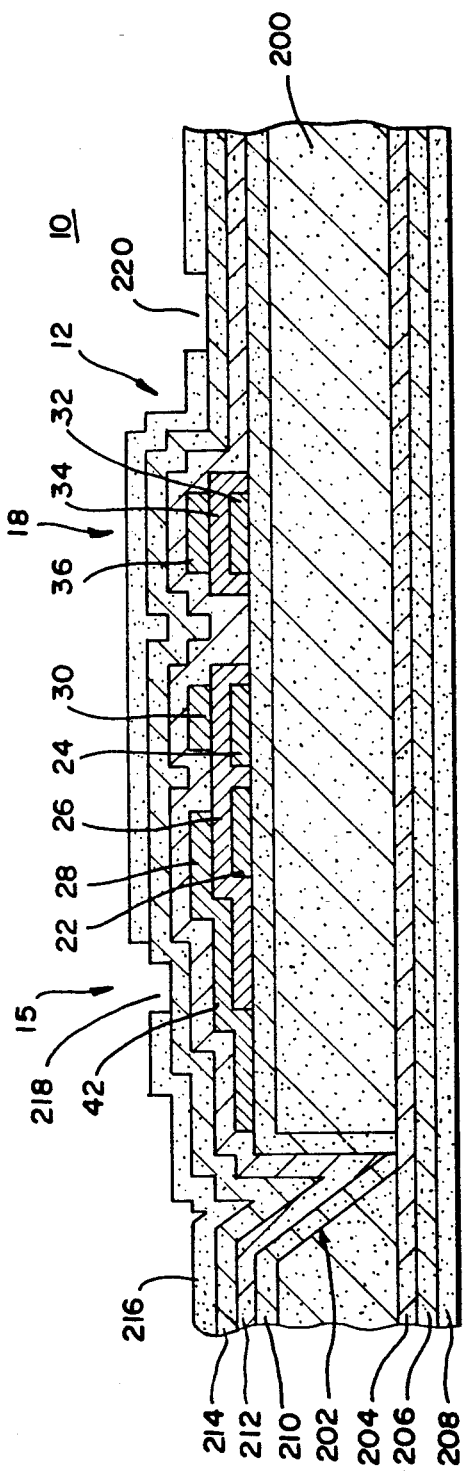

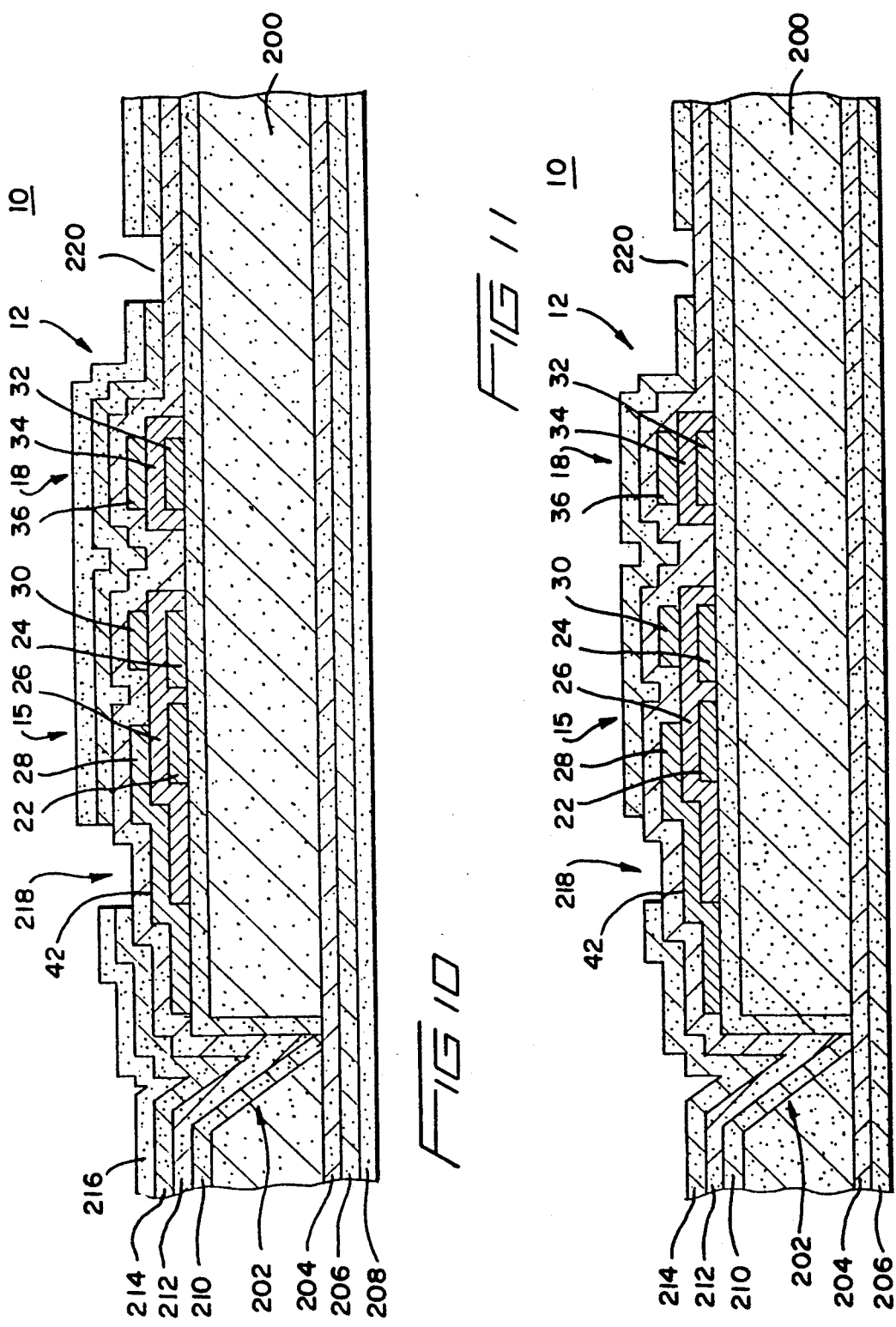

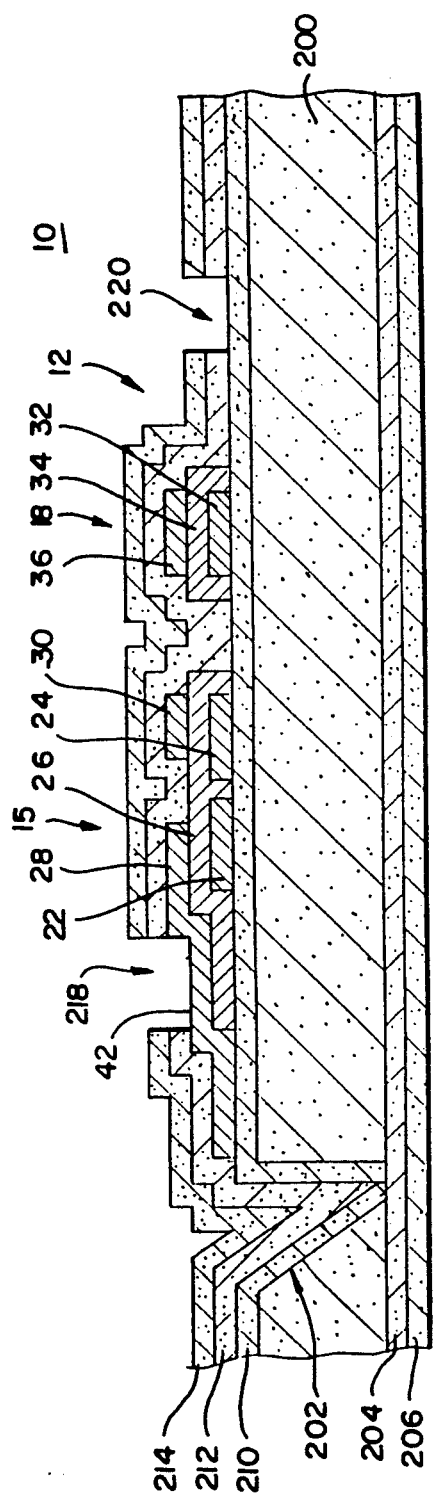
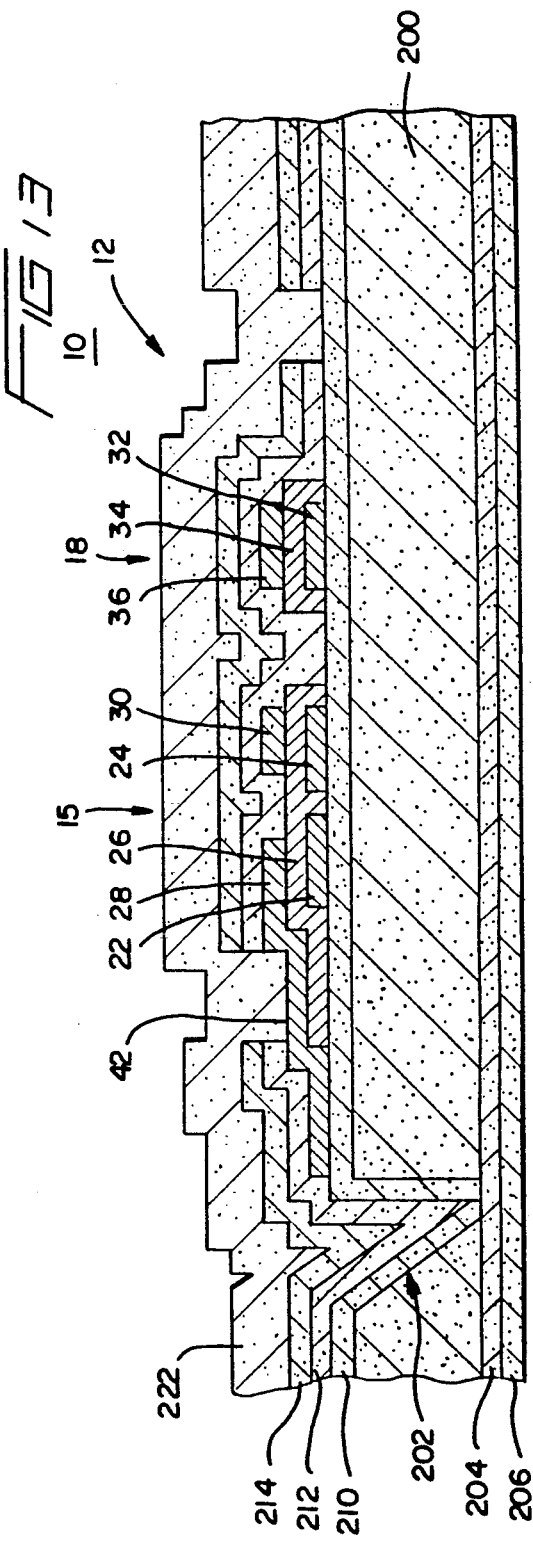

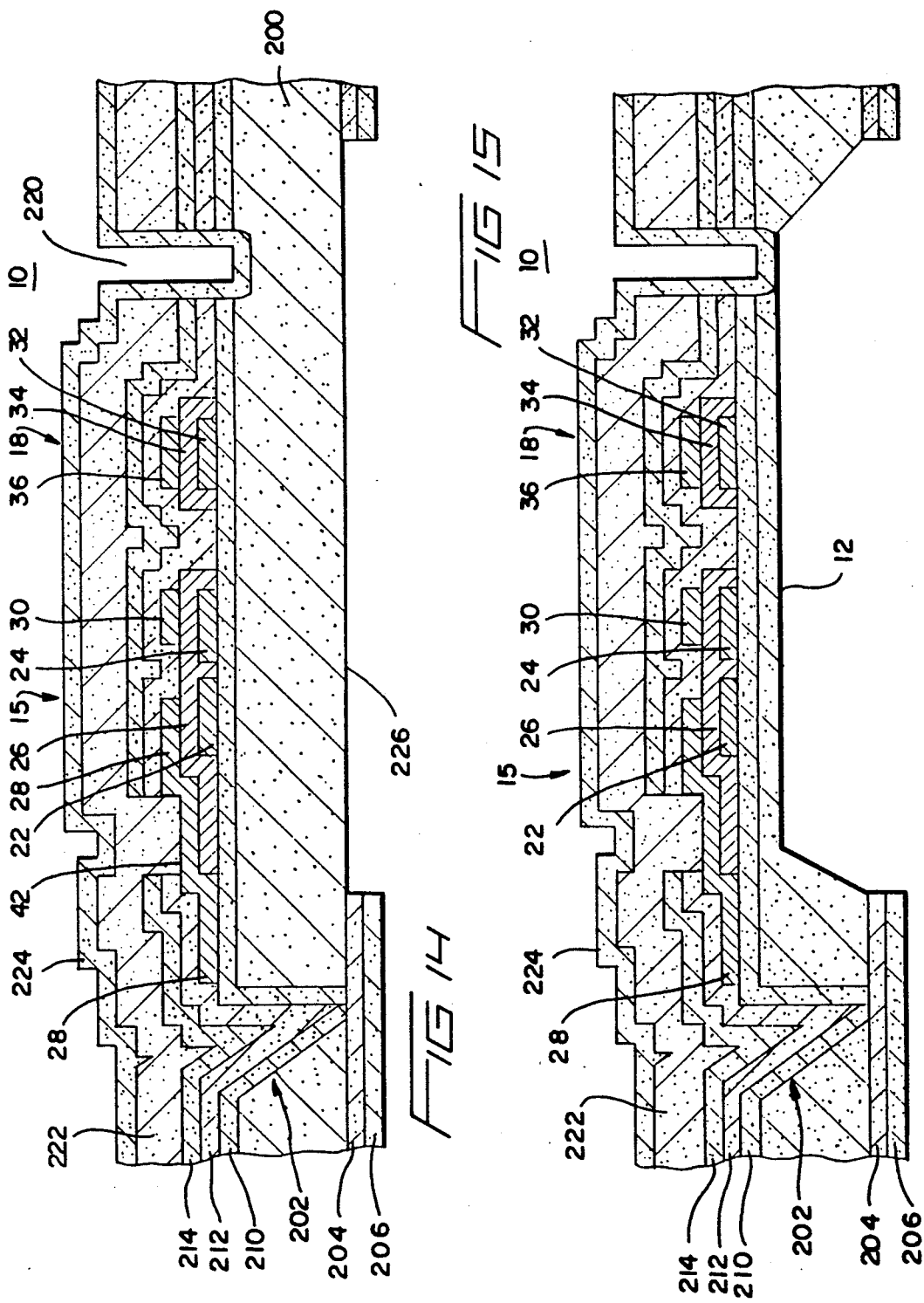

MICRO-BEAM TACTILE SENSOR FOR THE MEASUREMENT OF VERTICAL POSITION DISPLACEMENT

This is a continuation of copending application(s) Ser. No. 07/297,437 filed on Jan. 13, 1989, now U.S. Pat. No. 5,034,645 issued Jul. 23, 1991.

BACKGROUND OF THE INVENTION

The present invention relates, in general, to a piezoelectric beam type sensor for measuring the positions of objects, such as integrated circuit chipleads, and a method for making the same.

Very Large Scale Integrated Circuits (VLSI), such as memory circuits or microprocessors, are embodied in circuit chips which generally have many chipleads that are to be connected to a printed circuit board (PCB). In the assembly of the circuit chips to the PCB, the chips are placed on the board so that the chip leads are aligned with a plurality of soldering pads thereon. Sometimes, one or more of the chipleads may be bent such that they do not touch the soldering pads, which may result in a poor electrical or mechanical contact, if a contact is made at all. Obviously such bad connections degrade or even completely impair the operation of the electronic device of which the chips form a part.

In view of this, a device and technique is needed that can detect the position of the chipleads prior to the soldering operation so that any misaligned leads can be adjusted to be sure that properly soldered joints will be obtained.

SUMMARY OF THE INVENTION

The present invention provides a position sensing device for measuring object positions that is very accurate and compact. The sensor includes a flexible beam, on which is disposed at least a first piezoelectric tactile sensing element that generates an electrical signal when it comes in contact with an object, such a chiplead. Also disposed on the beam is a piezoelectric actuator element to which electrical signals are supplied in order to cause a bending of the beam.

In the operation of the sensor, the beam is positioned near the chipleads or other objects to be measured, and electrical signals are supplied to the piezoelectric actuator element of the beam to cause it to bend, and contact the chiplead. The tactile sensor provides an indication of when the beam contacts the chiplead, and the position of the chiplead can be determined from the value of the actuator signal at that point, which is indicative of the amount of bending, and thereby position, of the beam.

To improve the signal of the tactile sensor when the velocity of impact between the beam and the chiplead is very small, the beam is vibrated around its slowly changing bent position, in a harmonic of the beam. This is achieved by supplying an additional alternating current signal to the piezoelectric actuator element, and results in the acceleration at impact being quite high, and the signal generated by the tactile sensor being relatively large. At the same time, the slowly changing bent position of the beam will result in a very accurate measurement of the position of the object.

A plurality of the beams can be formed integrally in a side-by-side manner so that each of the beams can correspond to each of a plurality of adjacent chipleads. Since many conventional circuit chips include four rows of chipleads, one extending from each side of the chip, four rows of position sensing beams can be employed to simultaneously sense the positions of all of the leads of the chip.

In the fabrication of the beams, a unique photolithographic process is employed to form them from wafers of silicon. Conventional photolithography is utilized in the manufacture of integrated circuits to form the various circuit elements on a silicon wafer or chip. First, a number of layers of materials are deposited on the chip, with the top layer being a metal layer that will be used to form the actual circuit patterns. Next a layer of photoresist is spun over the metal layer. Then, the photoresist is exposed through a mask which defines the desired circuit pattern. The unexposed photoresist can then be dissolved and washed away, thereby leaving a photoresist mask on a surface of the wafer. Next, the portions of the metal layer not covered by the mask are removed by chemical etching. Finally, the photoresist mask is stripped, thereby leaving the circuit elements and patterns on the wafer.

In the manufacture of the silicon beam type tactile sensors, the beams are rather fragile, and are not rugged enough to withstand this type of photolithographic process, since the beams must be spun at high speed for the deposition of the photoresist, and might break. Consequently, once the beams have been etched out of the silicon wafers, the formation of the various circuit elements on the beams is made very difficult.

To avoid this problem, the present invention provides a process for fabricating the beams in which photolithographic processes are not employed once the beams are formed. This is accomplished by disposing a formation of layers of material on the silicon wafers before the beams are formeed in such a way, that after the beams have been made, the various elements on the beam can be exposed in a series of etching steps that require no other photolithographic steps. The technique esentially stores the images of the various elements in a number of successive layers that can be sequentially exposed by etching without the deposition and exposure of photoresist.

BRIEF DESCRIPTION OF THE DRAWINGS

The features of the present invention will become apparent from a consideration of the following detailed description of preferred embodiments thereof, taken in conjunction with the accompanying drawings, in which:

FIG. 1 is a side view of a position sensing beam;

FIG. 2 is an exploded perspective view of a position sensing beam showing actuator and sensor elements;

FIG. 3 is a top view of a position sensing beam;

FIG. 4 is a side view of a position sensing beam illustrating its operation;

FIGS. 5A–C are schematic block diagrams of the circuitry employed to operate one or more position sensing beams;

FIG. 6 is a perspective view of a position sensing device which includes a plurality of adjacent position sensing beams;

DETAILED DESCRIPTION OF THE PREFERRED EMBODIMENT

Figure 5A:
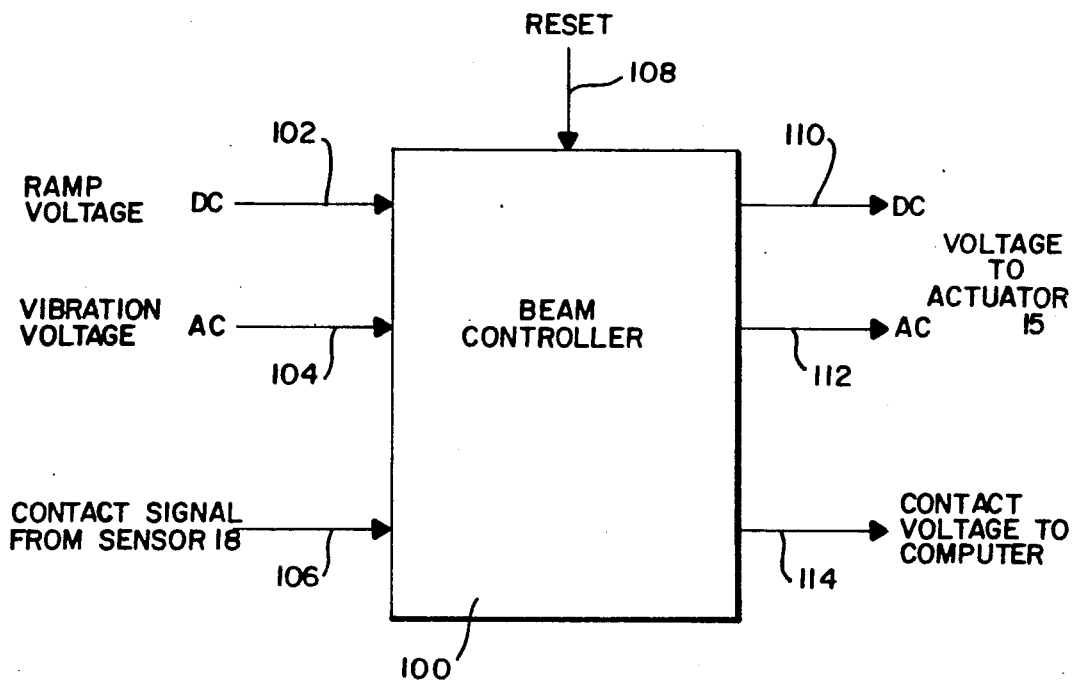

Turning now to a more detailed consideration of the preferred embodiments, there is illustrated in FIG. 1, a position sensing device 10 which is formed from a <100> oriented wafer of silicon, from which has been etched by anisotropic etching, a flexible beam 12. Beam 12 is designed to bend up and down to determine the position of an object with which it comes in contact, and is integrally formed with a rigid support frame 13. An angled face 14 of support frame 13 defines the <111> plane of the silicon which is left unetched by the anisotropic etching process. A piezoelectric actuator 15 is adhered to a top surface 16 of the beam 12, and causes the same to bend when an electrical signal is applied thereto. A piezoelectric sensor 18 is disposed on top surface 16 near a free end or tip 20 of beam 12, which sensor generates an electrical signal when it comes in contact with an object.

FIG. 2 is an exploded perspective view of the device 10 which better shows the relative locations of the piezoelectric actuator 15 and sensor 18, with actuator 15 being relatively large and covering a major portion of the beam 12, and 18 being smaller and disposed near the free end 20 of beam 12. As shown, actuator 15 and sensor 18 are both three layered structures. In particular, actuator 15 includes first and second bottom electrodes 22 and 24; a piezoelectric material layer 26, which can be zinc oxide for example; and, first and second top electrodes 28 and 30. Similary, sensor 18 includes a bottom electrode 32; a piezoelectric material layer 34; and, a top electrode 36.

Second bottom and top electrodes, 24 and 30 respectively, of actuator 15 are generally "u"-shaped, and surround on three sides, first bottom and top electrodes, 22 and 28, which are generally rectangular. As will be discussed in greater detail with reference to FIG. 4 below, the "u"-shaped electrodes are utilized to impart a vibration to actuator 15, and therefore beam 12, while the rectangular electrodes are utilized to control the static bending position of the beam 12.

Electrodes 32 and 36 of sensor 18 are utilzed as a voltage pick up means for a voltage which is induced in piezoelectric layer 34 as a result of the contact of the same with an object, such as a chiplead.

It should be noted that each of the top electrodes 28, 30, and 36 are slightly larger than their counterpart bottom electrodes, 22, 24, and 32, respectively. This is to reduce the possibility that fringing fields will be created from the bottom electrodes, which in the case of the actuator are to be powered, to any object above them. This is important if the position of the chipleads of a CMOS chip are to be measured because fringing fields could damage the circuits.

Turning now to FIG. 3, there is shown a top view of the assembled sensing device 10 which shows a plurality of bonding pads 40-50 for conducting electrical signals to the electrodes of actuator 15, and from the electrodes of sensor 18. In particular, bonding pad 40 is connected via a conductive path 52 to top electrode 36 of sensor 18, while bonding pad 50 is connected via an electrical path 54 to the bottom electrode 32 of sensor 18.

The remaining bonding pads 42-48 serve to supply electrical signals to the various electrodes of actuator 15. In particular, bonding pad 42 supplies current through a conductive path 56 to the rectangular first top electrode 28, while bonding pad 48 supplies current via a conductive path 58 to the "u"-shaped second top electrode 30. Similarly, bonding pads 44 and 46, supply electrical signals via a pair of conductive paths 60 and 62 to first and second bottom electrodes 22 and 24, respectively.

Actuator 15 is utilized to cause the bending of beam 12, and a variable DC voltage is applied to the large top and bottom electrodes 28 and 22 for this purpose. An AC voltage is applied to the smaller electrodes 30 and 24 to induce a vibration in the beam 12 for reasons to be discussed below. The beam will vibrate at the same frequency as the alternating voltage, and the frequency can be chosen so that it matches a resonant mode of the beam with a large amplitude at free end 20 where the piezoelectric sensor 18 is located.

Turning now to FIG. 4, the operation of the sensor to determine the position of an object, such as a chiplead 70, is illustrated. When a voltage is applied to the large top and bottom electrodes of piezoelectric actuator 15, the piezoelectric material of layer 26, will tend to expand or contract sideways as a result of its piezoelectric property, depending on the polarity of the applied voltage. The voltage will therefore cause the layer 26, and therefore the beam 12 to which the layer 26 is attached, to bend up or down with a constant radius of curvature over the area which is covered by the electrodes. The remaining area on the right hand side of the beam will remain straight, but will have a certain slope.

The voltage supplied to large top and bottom electrodes 28 and 22 is a static or quasistatic voltage which typically is changed slowly from one level to another level. The moment corresponding to this slowly varying voltage is also slowly varying, and is indicated in FIG. 4 by M. M is assumed to be such that the beam bends down under the influence of this moment, as illustrated. If at the same time, an alternating voltage of a relatively high frequency is applied to the top and bottom "u"-shaped electrodes 30 and 24, the resulting moments in forces will attempt to bend the beam in addition to the already existing quasistatic bending. The moments due to the alternating voltages are indicated in FIG. 4 by m.

The tip of beam will show a deflection D due to the static voltage as defined by the following formula:

$$D = \frac{-h_s d_{31} Vl(2L - l)}{(h_s + h_z)^3}$$

where $h_s$ is the thickness of the beam; $h_z$ is the thickness of piezoelectric layer 26; V is the voltage applied to large electrodes 28 and 22; L is the total length of the beam; l is the length of the beam from its junction to the frame 13 to the right most edge of actuator 15; and, $d_{31}$ is the piezoelectric coefficient which relates electric fields in the vertical direction to deformations in the horizontal direction. In the preferred embodiment, the thickness $h_s$ of the beam is chosen to be 17 microns; the thickness $h_z$ of the layer 26 is chosen to be 5 microns; the total length L of the beam is chosen to be 10 mm; and, the length l of the beam is chosen to be 6 mm.

The result of the alternating voltage applied to peripheral electrodes 30 and 24 is a vibrational motion of the beam of amplitude a at the tip 20 thereof as indicated in FIG. 4. Typically, the amplitude a is much smaller than the deflection D.

Figure 5B:
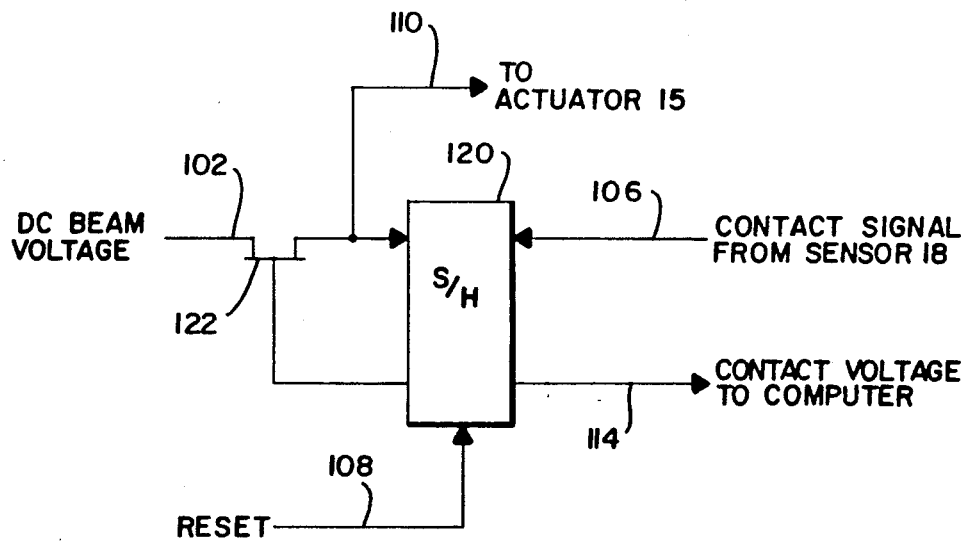

Turning now to FIGS. 5A-C, the circuitry that is employed with the position sensing device 10 is illustrated. In FIG. 5A, a beam controller 100 is shown having a DC ramp voltage input 102 and an AC vibration voltage input 104 (from sources not shown); a contact signal input 106 from sensor 18; and, a reset input 108. Beam controller 100 provides three outputs in response to these inputs: a DC beam voltage output 110 and an AC beam voltage output 112 for actuator 15; and, a contact voltage output 114 to be fed to a position 10 computer shown in FIG. 5C.

A detailed portion of the circuitry of beam controller 100 is shown in FIG. 5B. This includes a sample and hold circuit 120 and a switch 122. In the operation of the controller, when a contact signal is received from sensor 18 on input 106, the sample and hold circuit 120 samples the value of the DC beam voltage at that point, and outputs it as the contact voltage on output 114 to the position computer. At the same time, sample and hold circuit 120 supplies a signal to switch 122 which is inserted between the DC voltage input 102 and output 110, to disconnect the voltage from actuator 15. The sample and hold circuit 120 can then be externally reset on reset input 108 for the next measurement.

FIG. 5C shows how a plurality of beam position sensing devices can be monitored by a single position computer. Each of the beam contact voltages from the outputs 114 of each beam controller 100 are fed first to a multiplexer 130, then to an A/D converter 132, and finally to a position computer 134 which is programmed to determine the relative positions of contacted objects based on the DC contact voltage at the point of contact. In the case of chipleads on a multiple lead chip, a separate beam type position sensing device can be used for each chiplead, and the computer 134 can be programmed to detect if each of the chipleads are positioned within prescribed tolerances.

With the above circuitry, the measurement procedure of the position of an object would be carried out as follows. The beam, with no voltages applied to it, is positioned with its sensor below the object. The maximum static DC voltage would then be applied to bend the beam to its lowest position. Any suitable mechanical means would then be employed to raise the beam tip to a reference position so that it is still sufficiently low enough under the object that the beam will not touch it. An AC voltage, whose frequency is set to match a resonant mode of the beam, is then applied, and the tip of the beam is brought into vibration. Next, the DC voltage is changed slowly to gradually move the equilibrium position of the tip of the beam toward the object. At the instant that the tip touches the object, the deformation resulting from this contact in the sensor 18 will generate a signal that is fed to beam controller 100. When this signal is detected, the value of the DC voltage at that point is sampled by sample and hold circuit 120, and fed to position computer 134 which determines the position of the tip, and therefore of the object, by means of the previously discussed equation.

Figure 7:
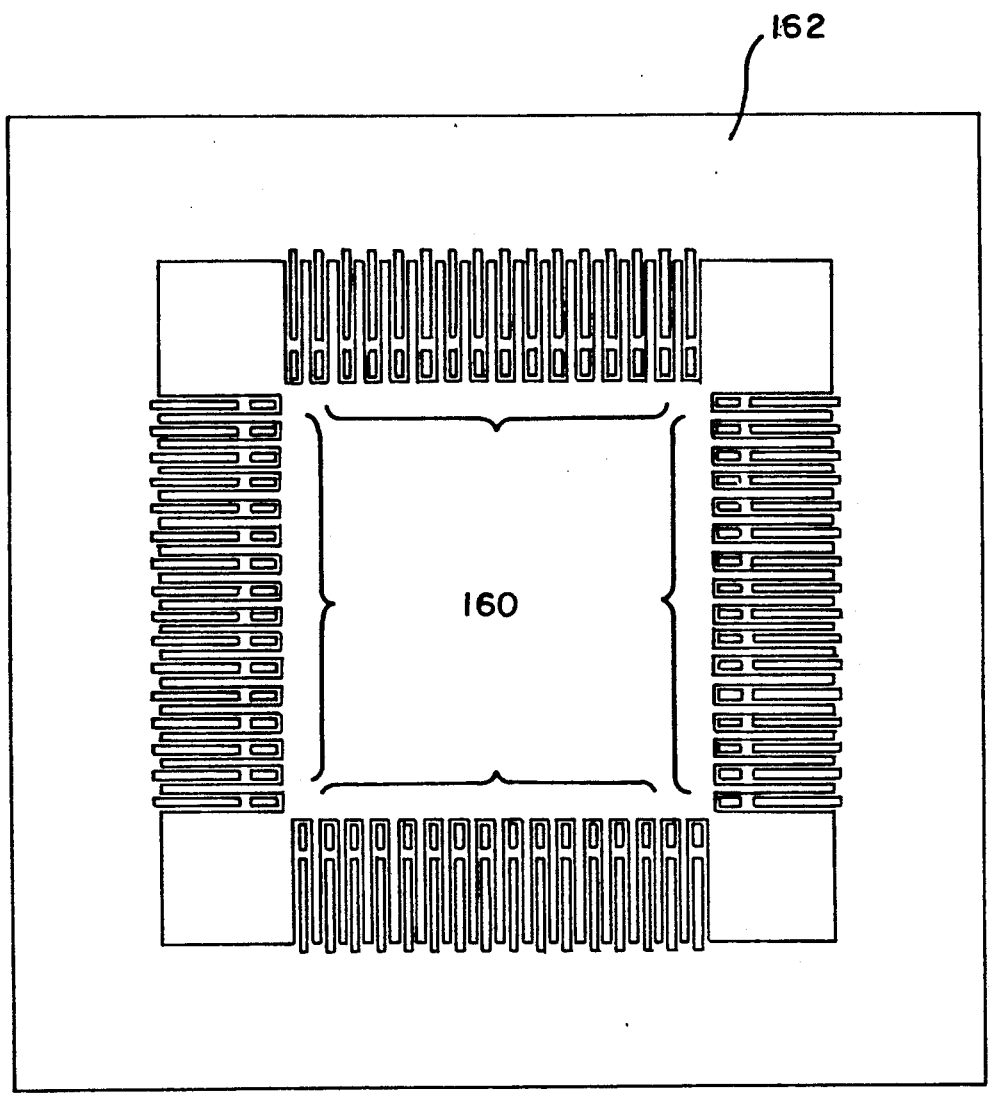
FIG. 7 is a diagrammatic illustration of a position measuring device for the simultaneous measurement of the positions of four rows of chipleads on a circuit chip; and, FIGS. 8–16 are partial cross sectional illustrations of a position sensing beam showing critical fabrication steps thereof.

Examples of position sensing devices which utilize plural beams are shown in FIGS. 6 and 7. Specifically, in FIG. 6, a row of 16 tactile position sensors 150 are shown that are etched altogether from a single wafer of silicon 152. In actual size, each of these sensors would have a typical length of about 20 mm; a width of about 2 mm; and, a height of about 0.3 mm. From a 4 inch wafer, a number of these rows could therefore be fabricated. In FIG. 7, a rectangular array of sensors 160 is illustrated which can be employed to simultaneously determine the positions of all of the chipleads of a large VLSI type chip. Again, sensor array 160 can be etched from a single wafer of silicon, and a peripheral framework 162 is provided to both protect the beams, and act as a means for handling the device.

The process by which the silicon beam 12 of FIGS. 1-7 is fabricated is illustrated in FIGS. 8-16. In FIG. 8, a partially fabricated beam type position sensing device 10 is shown that is formed on a silicon wafer 200. A number of layers of material are shown disposed on both the top and bottom sides of wafer 200, and these layers are preferably deposited and formed by using conventional semiconductor fabrication techniques including photolithography. To accommodate the use of photolithography on both the top and bottom sides of wafer 200, a generally V shaped alignment hole 202 is disposed in wafer 200 which can be used for the alignment of the photolithography masks on both sides of wafer 200.

Disposed on the bottom side of wafer 200 are three layers of material: a first layer 204 of silicon nitride ($Si_3N_4$); a second layer 206 of silicon oxide ($SiO_2$); and, a third layer 208 of photoresist. Another layer 210 of $Si_3N_4$ is disposed on the top side of silicon wafer 200. Disposed on top of layer 210 are a number of layers which form the piezoelectric actuator 15 and sensor 18 of the device 10. These include three separate chromium electrodes 22, 24 and 32, which form the bottom electrodes for the piezoelectric actuator 15 and sensor 18, respectively. Overlaying electrodes 22 and 24 is the layer of piezoelectric material 26, which is preferably zinc oxide. Similarly, another layer of zinc oxide 34 is disposed over electrode 32. A step shaped aluminum electrode 28 is disposed over and contact with silicon nitride layer 210 and zinc oxide layer 26, and is the first top electrode for the piezoelectric actuator 15. A second smaller aluminum electrode 30 acts as the second top electrode for actuator 15 and is disposed over a small portion of zinc oxide layer 26 as illustrated. Similarly, a third aluminum electrode 36 is disposed on top of zinc oxide layer 34 which, in conjunction with bottom electrode 32 and zinc oxide layer 34, forms piezoelectric tactile sensor 18. Protecting the piezoelectric actuator and sensor structures are three layers of material. These are a first layer of silicon nitride 212; a second layer of silicon dioxide 214; and a third layer of photoresist 216.

In order to complete the structure of the beam type sensor, the beam 12 must be etched from the silicon wafer 200, and bonding pads must be formed for electrically contacting the various electrodes. The bonding pad areas are usually formed in these types of structures by using conventional photolithographic techniques. However, in this particular structure, once the beams have been etched, it is difficult to apply the necessary layer of photoresist for the photolithographic process, since the beams must be spun at a high rate of speed during the deposition of the photoresist, and are too fragile to withstand the resulting accelerations. The present invention overcomes these difficulties by providing a process in which the areas for the bonding pads are formed before the beam etching process is carried out, and the areas are then covered up with a plurality of protective layers that are removed by etching after the beams have been formed. This process is illustrated in FIGS. 9-16, and is discussed below. It will be understod that although FIGS. 9-16 only illustrate the formation of bonding pad 42 for top electrode 28 of actuator 15, the same procedure is utilized for forming the bonding pads for the five other electrodes.

Turning now to FIG. 9, a pair of openings 218 and 220 are formed in top photoresist layer 216 by conventional photolithographic masking and exposure techniques. Opening 218 will be utilized for forming bonding pad 42 for top electrode 28, while opening 220 will be employed for form a moat in the semiconductor wafer 200 around the beam 12 so that it can be separated from the wafer at the end of the fabrication process. Openings for forming the bonding pads to the various other electrodes are not illustrated in these drawings, but are formed in an identical manner to that in whch the area for bonding pad 42 for electrode 28 is formed.

In FIG. 10, silicon dioxide layer 214 is next etched in the area of openings 218 and 220. Then, as illustrated in FIG. 11, bottom and top photoresist layers 208 and 216 are completely removed, after which the silicon nitride layer 212 in the area of openings 218 and 220 is also etched away. At this point, as shown in FIG. 12, opening 218 defines the bonding pad 42 for electrode 28. To effectively store the image of the bonding pad area in the structure while the beam is etched, a thick layer of silicon dioxide 222 is disposed completely over the top surface of beam 12 as illstrated in FIG. 13.

After a number of additional photolithographic steps, the structure looks as in FIG. 14, where the beam 12 is now ready to be etched from the silicon wafer 200. As illustrated, an additional layer of silicon dioxide 224 has been disposed over silicon dioxide layer 222, and covers the walls of moat opening 220 which extends all the way into the body of silicon wafer 200. Also, a large opening 226 has been etched into the silicon nitride and silicon dioxide layers 204 and 206 on the bottom side of wafer 200 to permit the beam 12 to be etched from the wafer. After the wafer 200 is etched by anisotropic etching, the moat from the side openings, and the beam appears as in FIG. 15. Finally, the various layers of silicon dioxide 214, 222, and 224 are etched off the top side of the beam 12 while silicon dioxide layer 206 is removed from the bottom side of the beam.

Figure 16:
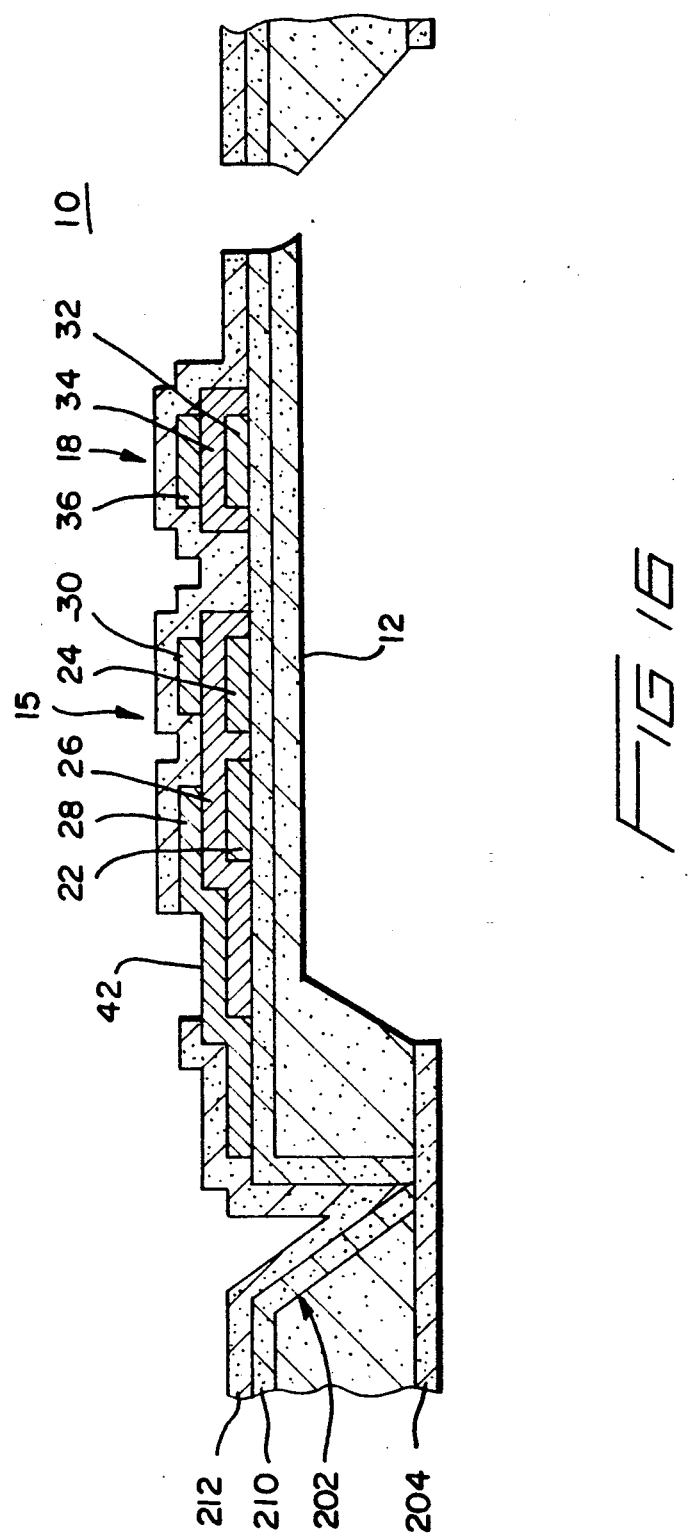

As can be seen from this process in FIG. 16, the only step necessary for exposing the bonding pad 42 of top electrode 28 is the etching of the various silicon dioxide layers, since the image of the bonding pad has already been previously formed. Consequently, no further application of photoresist to the structure is necessary once the beam has been etched (FIG. 15), and the beam therefore does not have to be exposed to any possible harm from the spinning process that is utilized to apply the photoresist.

Although the invention has been disclosed in terms of preferred embodiments, it will be understood that numerous variations and modifications could be made thereto without departing from the true spirit and scope of the invention as set forth in the following claims.

What is claimed is:
1. An object position measuring device comprising:
   at least a first flexible beam attached at a first end to a rigid support, and having a second, free end;
   first actuator means disposed on said first beam to deflect the free end of said first beam into contact with a first object whose position is to be measured;
   means to supply a variable signal to said first actuator means;
   first sensor means disposed on said first beam near said free end that generates an electrical signal in response to the contacting of said sensor by said first object whose position is to be measured; and,
   means to monitor said variable signal supplied to said first actuator means and the electrical signal generated by said first sensor means in response to contact of the first sensor means by said first object, so that the position of said first object can be measured from the magnitude of said variable signal at the point of contact of the first sensor means with said first object.

2. The device of claim 1 in which said beam is made of silicon.

3. The device of claim 2 wherein said silicon beam is etched from a silicon wafer.

4. The device of claim 1 wherein said sensor means is a piezoelectric tactile sensor.

5. The device of claim 1 wherein said variable signal is a variable DC voltage and said device further includes means to supply an AC voltage to said actuator means in addition to said variable DC voltage, to cause said beam to vibrate about an equilibrium point, and thereby increase the magnitude of the electrical signal generated by the sensor when it comes in contact with an object.

6. The device of claim 1 wherein said actuator means comprises:
   a layer of piezoelectric material;
   a first electrode disposed on a top surface of said layer; and,
   a second electrode disposed on a bottom surface of said layer, said first and second electrodes being electrically connected to said means to supply a variable signal to said actuator means.

7. The device of claim 6 wherein said first electrode serves as a ground electrode and is slightly larger in area than said second electrode to reduce the possibility of fringing fields being created from said second electrode to an object whose position is to be measured.

8. The device of claim 6 wherein said piezoelectric material is zinc oxide.

9. The device of claim 5 wherein said actuator means comprises:
   a layer of piezoelectric material;
   a first electrode disposed on a top surface of said layer;
   a second electrode disposed on a bottom surface of said layer, said first and second electrodes being electrically connected to said means to supply a variable signal to said actuator;
   a third electrode disposed on the top surface of said layer; and,
   a fourth electrode disposed on the bottom surface of said layer, said third and fourth electrodes being electrically connected to said means to supply an AC voltage.

10. The device of claim 9 wherein said first electrode serves as a ground electrode and is slightly larger in area than said second electrode to reduce the possibility of fringing fields being created from said second electrode to an object whose position is to be measured.

11. The device of claim 9 wherein said piezoelectric material is zinc oxide.

12. The device of claim 9 wherein said first and second electrodes are generally rectangular in shape, and said third and fourth electrodes extend in a peripheral manner around three sides of said first and second electrodes, respectively.

13. The device of claim 1 further comprising:

at least a second flexible beam attached at a first end to said rigid support and having a second, free end;

second actuator means disposed on said second beam to deflect the free end of said second beam into contact with a second object whose position is to be measured;

means to supply a variable signal to said second piezoelectric actuator means;

second sensor means disposed on said second beam near said free end that generates an electrical signal in response to the contacting of said second sensor by said second object whose position is to be measured; and, wherein said means to monitor the variable signal supplied to said first piezoelectric actuator and said electrical signal generated by said first sensor means in response to the contact of the first sensor means by said second object, also monitors the variable signal supplied to said second piezoelectric actuator means and an electric signal generated by said second sensor means in response to the contact of the second sensor means by said second object, so that the position of said second object can be measured from the magnitude of the signal supplied to said second actuator means at the point of contact of the second sensor means with said second object;

whereby, said object position measuring device can be employed to measure simultaneously the positions of a plurality of objects.

14. The device of claim 13 wherein said first and second beams and said rigid support are etched from a single silicon wafer.

15. The device of claim 13 wherein said means to monitor comprises:

a first sample and hold circuit for sampling the variable signal supplied to said first actuator means when an electrical signal is generated by said first sensor means;

a second sample and hold circuit for sampling the variable signal supplied to said second actuator means when an electrical signal is generated by said second sensor means;

a multiplexer connected to said sample and hold circuits for selectively outputting sampled voltages from said first and second sample and hold circuits;

an A/D converter connected to said multiplexer for digitizing the outputted sampled voltages; and, a position computer connected to said A/D converter for determining the positions of said first and second objects from said digital sampled voltages.

* * * * *